(12) United States Patent
Chowdhury et al.

(10) Patent No.: US 9,362,866 B2
(45) Date of Patent: Jun. 7, 2016

(54) ENVELOPE PATH PRE-DISTORTION FOR WIDEBAND TRANSMITTER SYSTEMS

(71) Applicant: Broadcom Corporation, Irvine, CA (US)

(72) Inventors: Debopriyo Chowdhury, San Diego, CA (US); Ali Afsahi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/100,931

(22) Filed: Dec. 9, 2013

(65) Prior Publication Data

US 2015/0146819 A1    May 28, 2015

Related U.S. Application Data

(60) Provisional application No. 61/908,955, filed on Nov. 26, 2013.

(51) Int. Cl.
| | |
|---|---|
| H04K 1/02 | (2006.01) |
| H04L 25/03 | (2006.01) |
| H04L 25/49 | (2006.01) |
| H03F 1/02 | (2006.01) |
| H03F 1/22 | (2006.01) |
| H03F 1/32 | (2006.01) |
| H03F 3/195 | (2006.01) |
| H03F 3/24 | (2006.01) |
| H03F 3/45 | (2006.01) |

(52) U.S. Cl.
CPC .............. *H03F 1/0227* (2013.01); *H03F 1/223* (2013.01); *H03F 1/3223* (2013.01); *H03F 3/195* (2013.01); *H03F 3/24* (2013.01); *H03F 3/45179* (2013.01); *H03F 2200/336* (2013.01); *H03F 2203/45394* (2013.01)

(58) Field of Classification Search
CPC ....... H03F 1/0027; H03F 1/3223; H03F 3/24; H03F 3/195; H03F 1/223; H03F 3/45179; H03F 2200/336; H03F 2203/45394
USPC ......................................................... 375/296
See application file for complete search history.

(56) References Cited

U.S. PATENT DOCUMENTS

| | | | | |
|---|---|---|---|---|
| 2010/0091900 A1* | 4/2010 | Gan | ............................... | 375/267 |
| 2012/0034139 A1* | 2/2012 | Alvarado | ....................... | 422/211 |

OTHER PUBLICATIONS

Hsia, Chin, et al., Digitally Assisted Dual-Switch High-Efficiency Envelope Amplifier for Envelope-Tracking Base-Station Power Amplifiers, IEEE Transactions on Microwave Theory and Techniques, vol. 59, No. 11, Nov. 2011, 10 pages.

* cited by examiner

*Primary Examiner* — Tanmay Shah
(74) *Attorney, Agent, or Firm* — Brinks Gilson & Lione (57) ABSTRACT

A communication device, such as a smart phone, includes an envelope tracking power supply modulator. The envelope tracking power supply modulator receives an envelope tracking reference signal. A baseband controller pre-distorts the envelope tracking reference signal responsive to distortion caused by the envelope tracking power supply modulator. For instance, the pre-distortion may modify the nominal envelope tracking reference signal so that, after the modulator acts on the modified reference signal, the output of the modulator has increased linearity.

20 Claims, 6 Drawing Sheets

ENVELOPE PATH PRE-DISTORTION FOR WIDEBAND TRANSMITTER SYSTEMS

CROSS REFERENCE TO RELATED APPLICATIONS

This application claims priority to U.S. Provisional Application Ser. No. 61/908,955 filed Nov. 26, 2013, which is incorporated by reference in its entirety.

TECHNICAL FIELD

This disclosure relates to envelope tracking power supplies that may be used, for example, in wireless communication devices.

BACKGROUND

Rapid advances in electronics and communication technologies, driven by immense customer demand, have resulted in the widespread adoption of mobile communication devices. The extent of the proliferation of such devices is readily apparent in view of some estimates that indicate that the number of wireless subscriber connections is nearly equal to the population of the entire world. Improvements in wireless communication devices will help continue to make such devices attractive options for the consumer.

DETAILED DESCRIPTION

Figure 1:
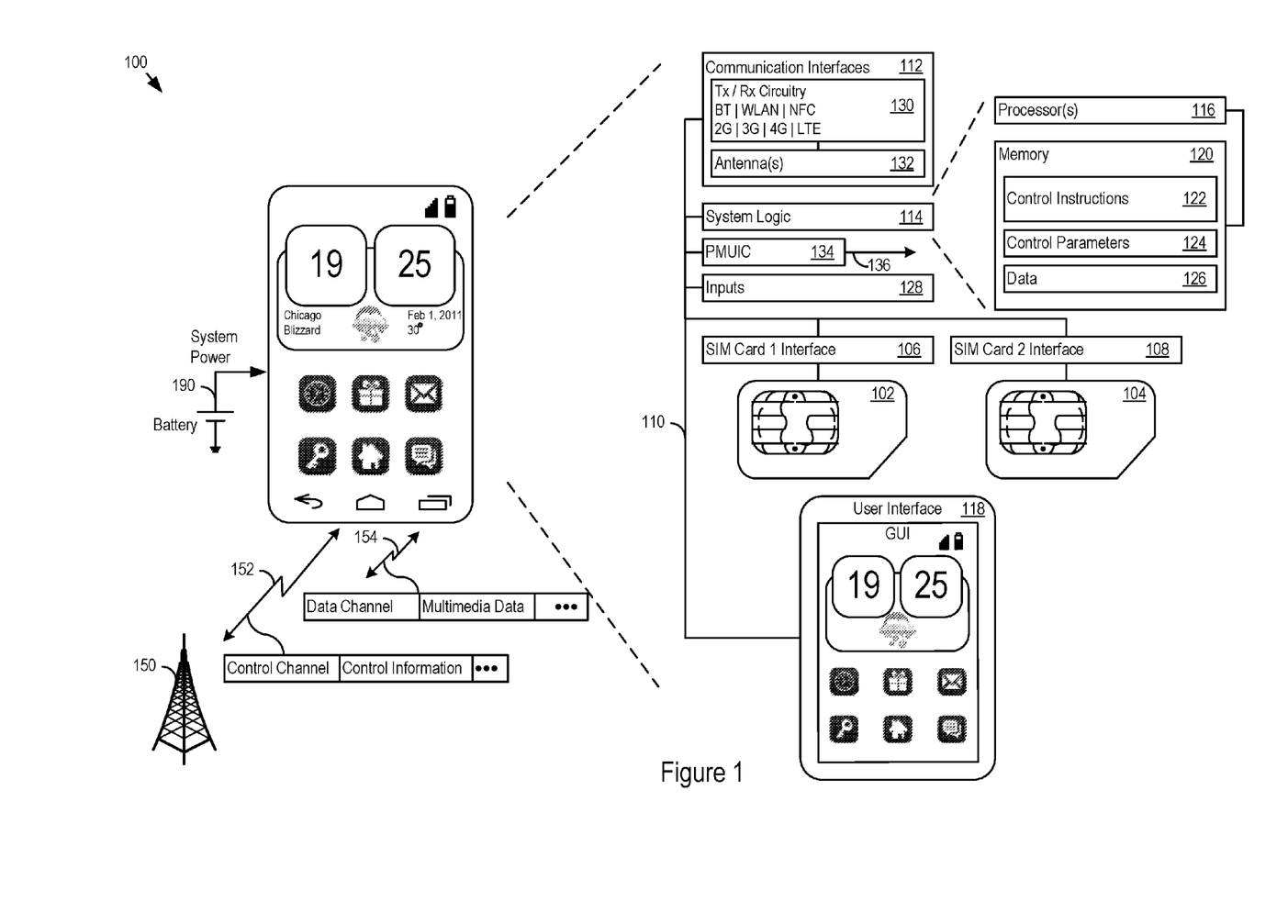
FIG. 1 shows an example of user equipment.

FIG. 1 shows an example of user equipment 100 ("UE 100"). The UE 100 is a smartphone in this example, but the UE may be any electronic device. The techniques described below regarding envelope path pre-distortion may be implemented in virtually any communications device. Accordingly, the smartphone example described below provides just one example context for explaining the pre-distortion techniques.

As one example, UE may be a 2G, 3G, or 4G/LTE cellular phone capable of making and receiving wireless phone calls, and transmitting and receiving data using 802.11 a/b/g/n/ac/ad ("WiFi"), Bluetooth (BT), Near Field Communications (NFC), or any other type of wireless technology. The UE may also be a smartphone that, in addition to making and receiving phone calls, runs any number or type of applications. UE may, however, be virtually any device that transmits and receives information, including as additional examples a driver assistance module in a vehicle, an emergency transponder, a pager, a satellite television receiver, a networked stereo receiver, a computer system, music player, or virtually any other device.

FIG. 1 shows an example of the UE 100 in communication with a network controller 150, such as an enhanced Node B (eNB) or other base station. The network controller 150 and UE 100 establish communication channels such as the control channel 152 and the data channel 154, and exchange data. In this example, the UE 100 supports one or more Subscriber Identity Modules (SIMs), such as the SIM1 102 and the SIM2 104. Electrical and physical interfaces 106 and 108 connect SIM1 102 and SIM2 104 to the rest of the user equipment hardware, for example, through the system bus 110.

The UE 100 includes communication interfaces 112, system logic 114, and a user interface 118. The system logic 114 may include any combination of hardware, software, firmware, or other logic. The system logic 114 may be implemented, for example, with one or more systems on a chip (SoC), application specific integrated circuits (ASIC), discrete analog and digital circuits, and other circuitry. The system logic 114 is part of the implementation of any desired functionality in the UE 100. In that regard, the system logic 114 may include logic that facilitates, as examples, decoding and playing music and video, e.g., MP3, MP4, MPEG, AVI, FLAG, AC3, or WAV decoding and playback; running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The user interface 118 and the inputs 128 may include a graphical user interface, touch sensitive display, voice or facial recognition inputs, buttons, switches, speakers and other user interface elements. Additional examples of the inputs 128 include microphones, video and still image cameras, temperature sensors, vibration sensors, rotation and orientation sensors, headset and microphone input/output jacks, Universal Serial Bus (USB) connectors, memory card slots, radiation sensors (e.g., IR sensors), and other types of inputs.

The system logic 114 may include one or more processors 116 and memories 120. The memory 120 stores, for example, control instructions 122 that the processor 116 executes to carry out desired functionality for the UE 100. The control parameters 124 provide and specify configuration and operating options for the control instructions 122. The memory 120 may also store any BT, WiFi, 3G, or other data 126 that the UE 100 will send, or has received, through the communication interfaces 112. The UE 100 may include a power management unit integrated circuit (PMUIC) 134. The PMUIC 134 may govern outputs from the system power 190, which may include a power source such as a battery. In a complex device like a smartphone, the PMUIC 134 may be responsible for generating as many as thirty (30) different power supply rails 136 for the circuitry in the UE 100.

In the communication interfaces 112, Radio Frequency (RF) transmit (Tx) and receive (Rx) circuitry 130 handles transmission and reception of signals through one or more antennas 132. The communication interface 112 may include one or more transceivers. The transceivers may be wireless transceivers that include modulation/demodulation circuitry, digital to analog converters (DACs), shaping tables, analog to digital converters (ADCs), filters, waveform shapers, filters, pre-amplifiers, power amplifiers and/or other logic for transmitting and receiving through one or more antennas, or (for some devices) through a physical (e.g., wireline) medium.

The transmitted and received signals may adhere to any of a diverse array of formats, protocols, modulations (e.g., QPSK, 16-QAM, 64-QAM, or 256-QAM), frequency channels, bit rates, and encodings. As one specific example, the communication interfaces 112 may include transceivers that support transmission and reception under the 2G, 3G, BT, WiFi, and 4G/Long Term Evolution (LTE) standards. The techniques described below, however, are applicable to other wireless communications technologies whether arising from the 3rd Generation Partnership Project (3GPP), GSM® Association, IEEE, Universal Mobile Telecommunications System (UMTS), High Speed Packet Access (HSPA)+, or other partnerships or standards bodies.

As just one implementation example, the communication interface 112, system logic 114, and PMUIC 134 may include a BCM2091 EDGE/HSPA Multi-Mode, Multi-Band Cellular Transceiver and a BCM59056 advanced power management unit, controlled by a BCM28150 HSPA+ system-on-a-chip (SoC) baseband smartphone processer or a BCM25331 Athena™ baseband processor. These devices or other similar system solutions may be extended as described below to provide the additional functionality described below. These integrated circuits, as well as other hardware and software implementation options for the UE 100, are available from Broadcom Corporation of Irvine Calif.

Figure 2:
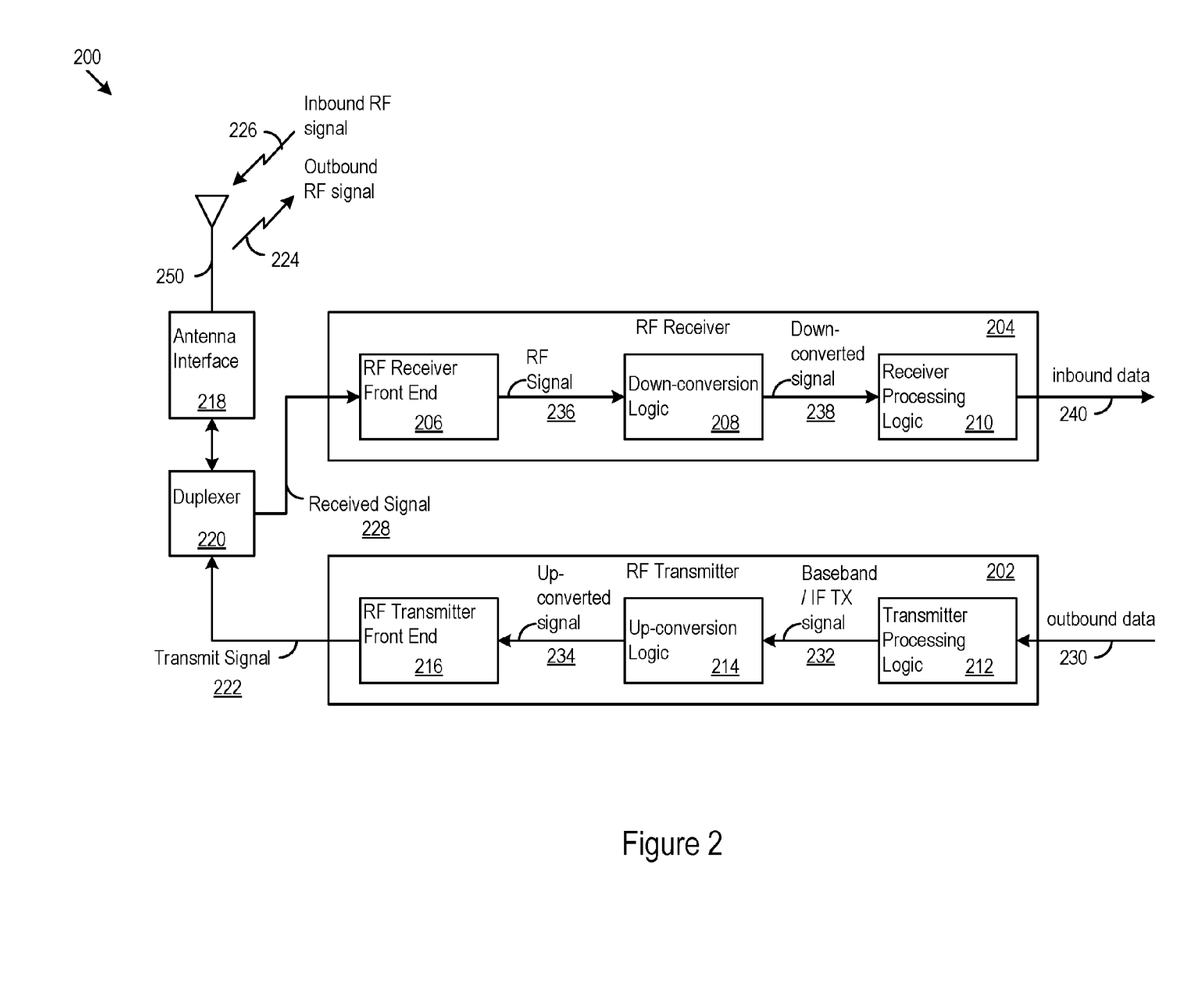
FIG. 2 shows an example of a radio transceiver.

FIG. 2 shows an example of a radio transceiver 200 that may be used in the UE 100 or any other UE. The radio transceiver 200 includes an RF transmitter 202 and an RF receiver 204. The RF receiver 204 includes a RF receiver front end 206, down-conversion logic 208 and receiver processing logic 210. The RF transmitter 202 includes transmitter processing logic 212, up-conversion logic 214, and a RF transmitter front end 216.

The RF receiver 204 and RF transmitter 202 are each coupled to an antenna 250 through an antenna interface 218 and a duplexer 220. The duplexer 220 couples the transmit signal 222 to the antenna 250 to produce the outbound RF signal 224, and couples the inbound RF signal 226 to the receive path to capture a received signal 228. Alternatively, a transmit/receive switch can be used in place of duplexer 220.

The RF transmitter 202 receives outbound data 230. The transmitter processing logic 212 formats the outbound data 230 in accordance with any particular protocol to produce a baseband or low intermediate frequency (IF) transmit (TX) signal 232, which may include an outbound symbol stream that contains outbound data 230. The baseband or low IF TX signals 232 may be digital baseband signals (e.g., have a zero IF) or IF signals, where the IF may, as just one example, be in a frequency range of one hundred kilohertz to a few megahertz. Note that the processing performed by the transmitter processing logic 212 can include, as examples, scrambling, encoding, puncturing, mapping, encryption, modulation, and digital baseband to IF conversion.

The up-conversion logic 214 includes, for examples, a digital-to-analog conversion (DAC) module, a filtering and/or gain module, and a mixing section. The DAC module converts the baseband or low IF TX signals 232 from the digital domain to the analog domain. The filtering and/or gain module filters and/or adjusts the gain of the analog signals prior to providing the signals to the mixing section. The mixing section converts the analog baseband or low IF signals into up-converted signals 234 according to the frequency of the transmitter local oscillator used for mixing.

The RF transmitter front end 216 includes a power amplifier and may also include a transmit filter module. The power amplifier amplifies the up-converted signals 234 to produce the transmit signals 222. The transmitter transmits the outbound RF signals 224 via an antenna interface 218 coupled to the antenna 250. The antenna interface 218 may provide impedance matching and bandpass filtering, as examples.

The power amplifier consumes a significant fraction of the overall power consumed by the UE. Accordingly, techniques that reduce the power consumption of the power amplifier can have significant impact on the overall battery life of the UE. In order to enhance the efficiency of the power amplifier, an envelope tracking power supply modulator may provide the voltage supply to the power amplifier. In fixed voltage implementations, the power amplifier is operated from a constant supply voltage. However, in systems that involve modulation standards incorporating high peak-to-average power ratios (PAPR), varying the power amplifier power supply (instead of holding it constant) according to the envelope of the RF input signal can lead to substantial power savings.

The RF receiver 204 receives inbound RF signals 226 via the antenna 250 and antenna interface 218 and provides the received signals 228 to the RF receiver front end 206. The antenna interface 218 may provide impedance matching of the antenna 250 to the RF receiver front end 206 and bandpass filtering of the inbound RF signals 226, as examples. The RF receiver front end 206 recovers the RF signal 236.

The down-conversion logic 208 may include a mixing section, an analog to digital converter (ADC), filtering logic, and gain control, as examples. The mixing section converts the RF signal 236 into a down converted signal 238 at an IF corresponding to a local oscillator used in the mixing section. The ADC converts the analog baseband or IF signal into a digital baseband or IF signal. The resulting signal includes an inbound symbol stream.

The receiver processing logic 210 processes the baseband or IF signal 238 according to any implemented protocol to produce inbound data 240. Examples of the processing performed by the receiver processing logic 210 include digital intermediate frequency to baseband conversion, demodulation, demapping, depuncturing, decoding, decryption, and descrambling.

Figure 3:
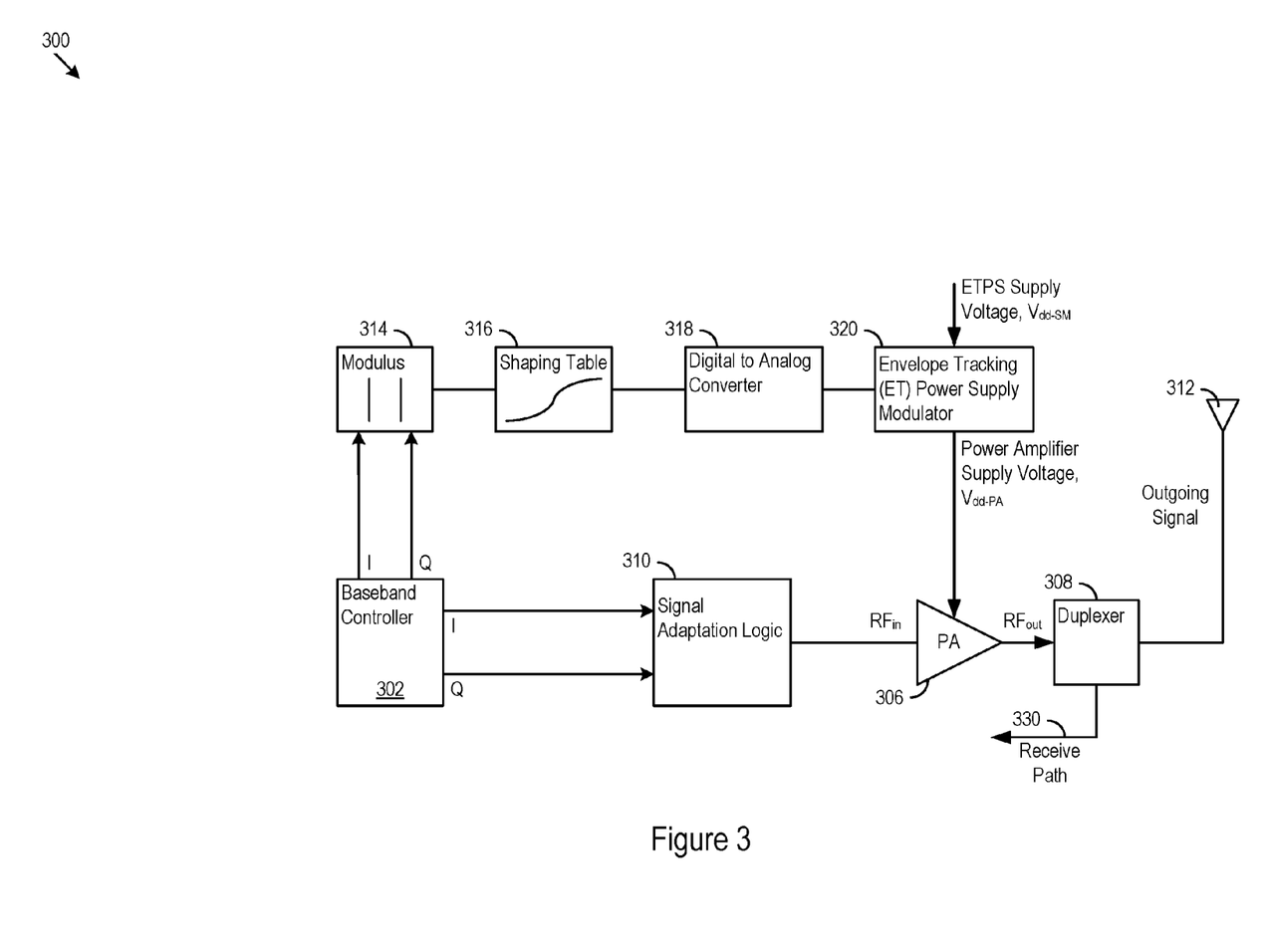
FIG. 3 is an example of a radio transmitter.

FIG. 3 shows an example transmitter 300 that may be present in the UE 100. The transmitter 300 may be implemented by any combination of a baseband controller, RF IC, power amplifier, and envelope tracking power supply, and other circuitry. Accordingly, the transmitter 300 may map to one or more portions of the communication interface 112 and the system logic 114.

In the example in FIG. 3, the transmitter 300 includes a baseband controller 302, a power amplifier (PA) 306, and a duplexer 308. Signal adaptation logic 310 is also present, and may modify the transmit signal samples generated by the baseband controller 302, prior to generation of the preamplifier output signal Vpa that drives the PA 306. As just a few examples, the signal adaptation logic 310 may implement digital predistortion; pre-emphasis or baseband gain; I and Q DACs, analog filters, and mixers for upconversion to a selected center frequency; and pre-amplification by a PA driver. The duplexer 308 may implement a transmit/receive switch under control of the system logic 114, e.g., under control of the baseband controller 302. In one switch position, the duplexer 308 passes amplified transmit signals from the PA 306 through the antenna 312. In a different switch position, the duplexer 308 passes received signals from the antenna 312 to a receive path for further processing.

The baseband controller 302 may be part of the system logic 114. The baseband controller 302 provides, e.g., inphase/quadrature (I/Q) signal samples of a desired transmit signal to the modulus logic 314. The modulus logic 314 may output the absolute value (e.g., the square root of I squared plus Q squared) of the transmit signal to a shaping table 316. The shaping table 316 maps input values to output values in a linear or non-linear manner. The output of the shaping table 316 feeds the digital to analog converter (DAC) 318. In turn, the DAC 318 outputs the envelope of the transmit signal as modified by the shaping table as a reference input signal to the envelope tracking power supply modulator 320 ("supply modulator 320").

The power supply modulator 320 receives the reference envelope signal from the DAC 318. The power supply modulator 320 outputs a PA power supply voltage, $V_{dd-PA}$, that approximately follows the envelope signal. The power supply modulator 320 creates $V_{dd-PA}$ using the power supply modulator 320 power supply voltage, $V_{dd-SM}$, as its power source, e.g., a fixed DC voltage input $V_{dd-SM}$=3.3 V.

Figure 4:
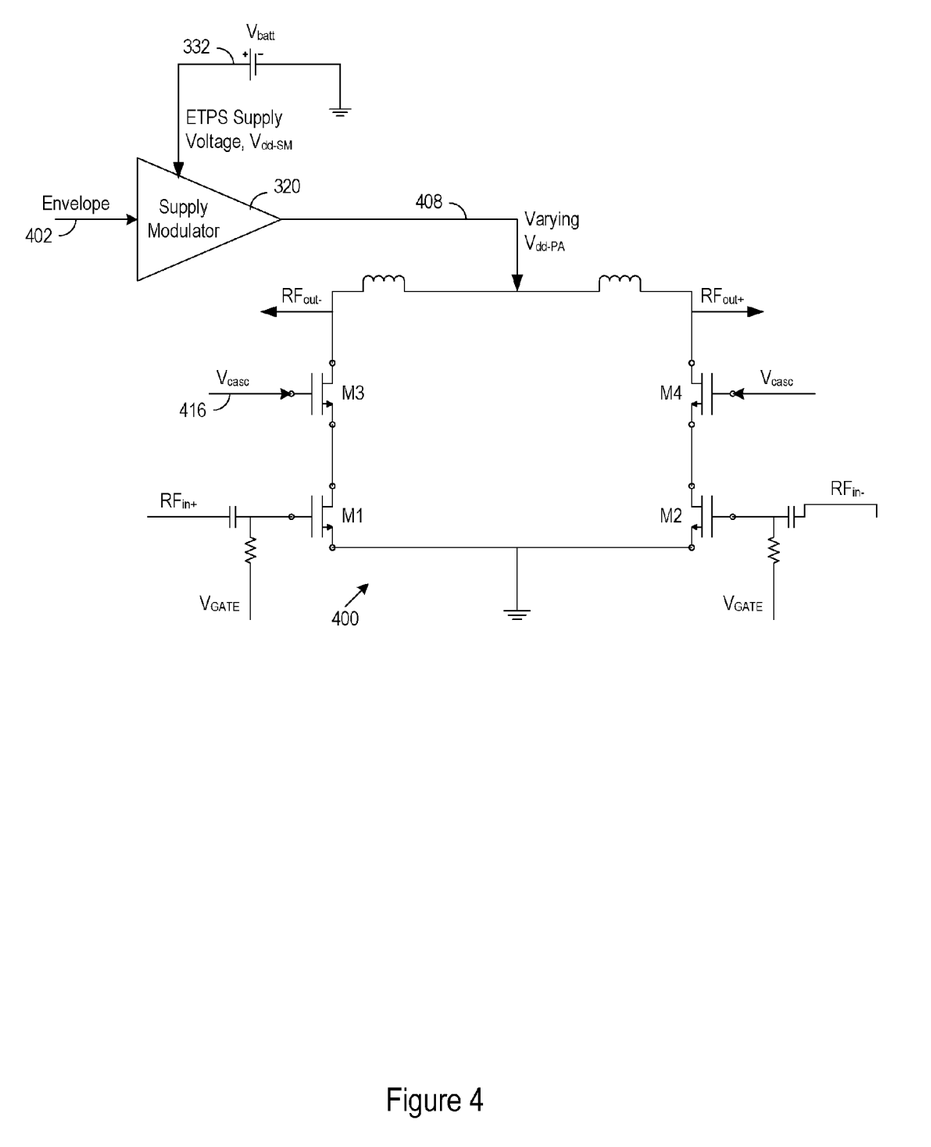
FIG. 4 shows an example implementation of a power amplifier.

FIG. 4 shows an implementation of envelope tracking CMOS cascode power amplifier 400 ("PA 400"), which may be used in any of the device implementations described above or below. The power supply modulator 320 may drive any other types or configurations of PAs than that shown in FIG. 4, however. The power supply modulator 320 receives power from a power supply, such a low dropout voltage regulator that conditions the UE battery voltage, e.g., to provide a fixed nominal 3.3V supply for the power supply modulator 320. It may also connect directly to the battery of the UE 100. The power supply modulator 320 receives tracked envelope information in the envelope signal input 402 (e.g., from the DAC 318), and the power supply modulator 320 generates an envelope tracking supply voltage $V_{dd-PA}$ on the voltage supply output 408.

The PA 400 may be implemented in nanoscale CMOS technology. It may be implemented in any other technology, including, but not limited to SiGe, bipolar, GaAs, InGaP, or other technologies. In the example configuration show, the PA 400 employs a cascode configuration using a stack of thick-oxide and thin-oxide core devices. Transistors M1 and M2 are the thin-oxide core devices which amplify the input RF signal and determine the gain of the amplifier.

Transistors M3 and M4 are stacked on top of the thin-oxide devices, and are referred to as the cascode transistors. Transistors M3 and M4 may be thick-oxide devices that can withstand high voltage stress. This helps overcome the low breakdown voltages of the thin oxide devices and allows operation of the PA 400 from a higher supply voltage $V_{dd-PA}$ swings, such as swings up to 3.3V. This may improve the output power and efficiency of the PA 400. The cascode transistors M3 and M4 are biased by the bias voltages, e.g., $V_{CASC}$ 416.

Figure 5:
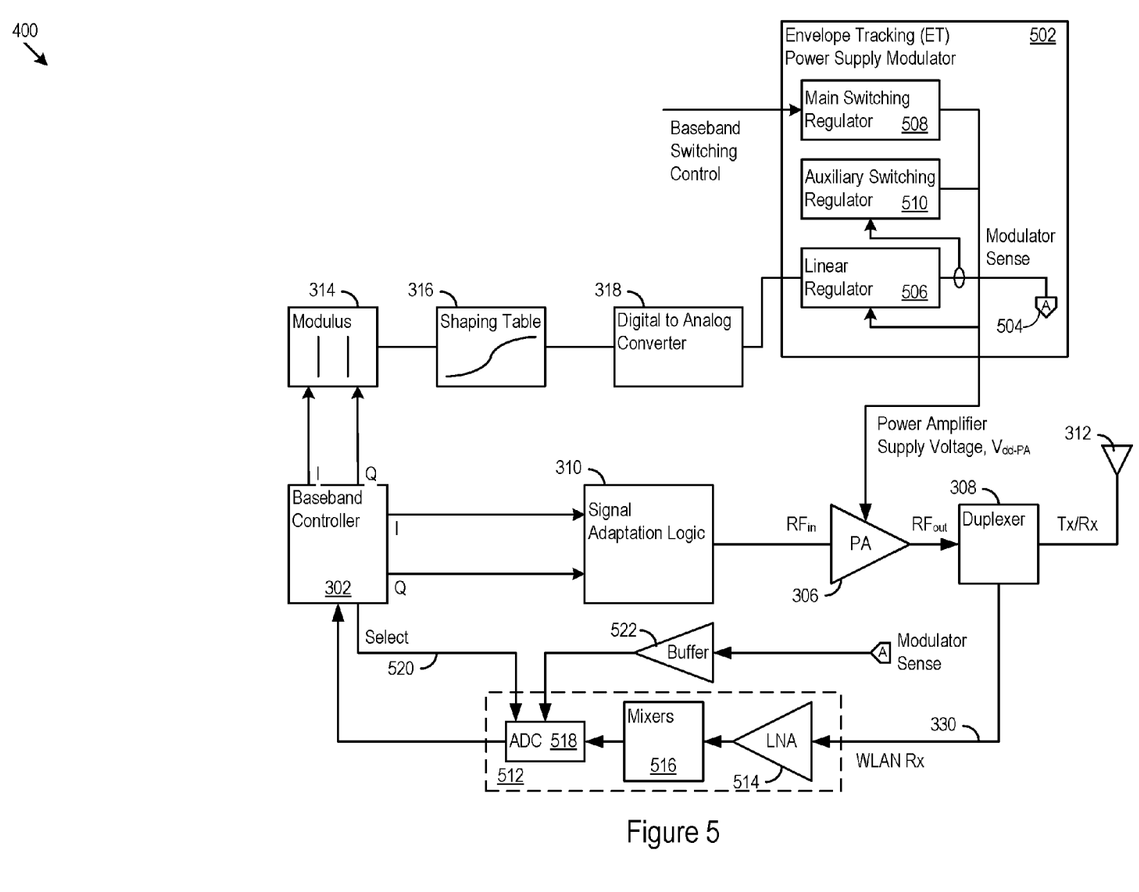
FIG. 5 shows an envelope tracking power supply modulator with a modulator sense output.

FIG. 5 shows, as one example implementation of the power supply modulator 320, an envelope tracking power supply modulator 502 that includes a modulator sense output 504. In this example, the power supply modulator 502 includes a linear regulator 506, a main switching regulator 508, and an auxiliary switching regulator 510 in parallel. The main switching regulator 508 may by controlled by the baseband controller 302 and may provide the majority of the current supplied to the PA 306. The auxiliary switching regulator 510 may provide current at intermediate frequencies. The linear regulator 506 (which may include a loop filter to reduce tracking error) may be implemented as a voltage source that corrects differences between the expected output and the output that the main switching regulator 508 and auxiliary switching regulator 510 are actually providing in parallel. In other implementations, the power supply modulator 502 employs a linear stage and a primary switching stage (e.g., a buck switching regulator) in parallel, with the linear stage sourcing or sinking auxiliary current to reduce the error between the desired output current and the current provided by the primary switching stage.

The modulator sense output 504 may provide an envelope sense signal that feeds back to the baseband controller 302. In one implementation, existing receive circuitry facilitates providing the feedback. For instance, WLAN receive circuitry 512 may already exist in the UE 100, and may include, e.g., a low noise amplifier (LNA) 514, mixers 516, and an analog to digital converter 518. The modulator sense output 504 may pass through the buffer 522 to reach an ADC input. The baseband controller 302 may provide a selection signal output 520 that directs the ADC 518 to digitize a signal on a particular ADC input, and thereby may determine to receive digital samples of the modulator sense signal.

The modulator sense output 504 may be sensed in the voltage domain. However, additional or alternative sensing mechanisms such as current sensing may be employed. The sensed voltage is provided to a buffer circuit. The buffer circuit may be an amplifier, attenuator, detector, or any other analog or digital circuit. The buffer circuit may condition the modulator sense output 504 to bring it within the dynamic range of subsequent circuitry, e.g., an ADC or baseband circuitry. In one implementation, the buffer circuit is a voltage feedback operational amplifier with rail-to-rail swing capability.

The power supply modulator 502 generates, according to a linearity characteristic, an envelope tracking power supply signal (e.g., voltage $V_{dd-PA}$) responsive to the envelope tracking reference signal received from the DAC 318. The envelope sense signal reflects the non-linearity characteristic of the supply modulator, such as non-linear distortion, slew-rate limitations, frequency-dependent gain and phase roll off. The sensed signal captures the effects of these non-linearities and other imperfections in the power supply modulator 502 that cause distortions in the envelope tracking power supply signal. The baseband controller 302 receives the envelope sense signal (e.g., in digital form), and pre-distorts the envelope tracking reference signal. The baseband controller may do so by comparing the envelope sense signal against the known expected envelope signal, determining a correction, and distorting the envelope tracking reference signal to compensate for the distortion. The correction may be, e.g., to impart the inverse of the linearity characteristic into the envelope tracking reference signal received by the power supply modulator 502. As a result, after the power supply modulator 502 operates on the pre-distorted envelope tracking reference signal, the result is an envelope tracking reference signal with less distortion, e.g., improved linearity.

Note that in a wireless standard employing complex modulation (e.g., Inphase (I) and Quadrature (Q) modulation), the RF signal is obtained as $VRF = I\cos(\omega t) + Q\sin(\omega t)$ As noted above, the envelope of the RF signal is obtained as $ENV = |VRF| = \text{SquareRoot}(I^2 + Q^2)$ The non-linear operations involved in the envelope generation (e.g., the squaring and square-root operations) cause a bandwidth (BW) expansion on the envelope path that leads to the power supply modulator 502. As a result, the bandwidth on the envelope path may be 3 to 4 times or more than the bandwidth on the RF signal path.

With the rapid growth of wireless technology, customers demand higher data rates. These data rates support many different applications, including video streaming that consume significant bandwidth. New wireless standards attempt to address the need for additional bandwidth. As an example, Wireless Local Area Network (WLAN) is one such standard where bandwidth requirements are increasing over time. The original 802.11g/a standard required 20 MHz of RF bandwidth, while the 802.11n standard expanded that to 40 MHz. Very recently, the 802.11ac standard has been introduced which expands the RF bandwidth to 80 MHz and even provides the option of 160 MHz transmission bandwidth.

As the RF signal bandwidth increases, the envelope bandwidth, as explained earlier, increases even more. Hence, for wideband systems, the envelope tracking supply modulator design may become complex, while at the same time, being very important for providing the desired operational characteristics that support wideband operation. The supply modulator may need to meet several demanding specifications simultaneously in a transmitter system, including linearity, efficiency, and gain specifications.

Regarding linearity, the power supply to the power amplifier is preferably varied accurately according to the envelope signal. If the supply modulator (e.g., due to the non-linearity of the linear regulator 506) introduces distortion, then the power supply of the PA does not remain an accurate replica of the envelope signal. This in turn introduces distortion at the output of the PA. Most if not all wireless standards mandate high linearity requirements from the transmitter. The distortion of the power supply modulator 502 at high bandwidths may increase the difficulty of meeting spectral mask, error vector magnitude (EVM), and other requirements.

Regarding efficiency, the overall efficiency of the envelope tracking system is the product of the power amplifier efficiency and the supply modulator efficiency. Hence, high efficiency over a wide bandwidth is a design goal. Regarding gain, another design goal is to have constant gain over high bandwidth. Doing so helps to amplify the envelope signal with high fidelity. If the power supply modulator 502 does not have constant gain across bandwidth, then distortions occur (e.g., high frequency signals will be attenuated) in the PA power supply signal.

These challenges are increased due to the use of nanometer CMOS technology in the envelope tracking system, including the power supply modulator 502 and PA 306. The CMOS technology introduces several different types of analog imperfections. These imperfections make it more difficult to meet the design goals without compromising on efficiency. However, the current pre-distortion techniques provide a mechanism for correcting the power supply modulator imperfections in the digital domain, e.g., using the baseband controller 302 to pre-distort the envelope signal.

In more detail, assume for the purposes of discussion that the output of the supply modulator, voltage Vdd–PA, should be a replica of the envelope signal: Vout=A*Venv, where Vout is the output of the supply modulator, A is a constant gain and Venv is the desired envelope voltage. However, because of distortion in the power supply modulator 502, the output deviates from the linear amplification form described above and has distortion components in it.

Assume that Vout=f(Venv), where 'f' is the transfer function of the power supply modulator 502. The transfer function may include effects other than linearity imperfections. Assume also that instead of passing the envelope signal to the power supply modulator 502, the baseband controller 302 provides a pre-distorted envelope (Venv_pd) signal to it. If the pre-distorted signal is the inverse of the transfer function 'f', then after passing through the power supply modulator 502, the non-linearity will be canceled and the output of the power supply modulator 502 will be an accurate replica of the desired envelope signal.

To that end, the baseband controller 302 (or other processing logic) pre-distorts the envelope signal fed to the power supply modulator 502. The pre-distortion compensates for non-linearity characteristics or other imperfections in the operation of the power supply modulator 502. The pre-distortion may happen in the digital domain, even over wide bandwidths. In part, wide bandwidth corrections may happen because clock rates in nanometer CMOS technology tend to be very fast. Further, the power consumption of performing the correction in the digital domain may be small, particularly compared to performing the corrections in the analog domain. In other words, the pre-distortion techniques described here combine the power of digital processing with analog design and facilitate the adoption of envelope tracking power supplies even for wideband power supply modulators (e.g., for use with 802.11/g/n/ac/ad wireless networking, or any other wideband communication systems). In other implementations, the pre-distortion techniques allow design changes to the power supply modulator 502 to increase the efficiency of the power supply modulator 502, while sacrificing some linearity, because the non-linearity may be corrected by the pre-distortion of the envelope reference signal.

Figure 6:
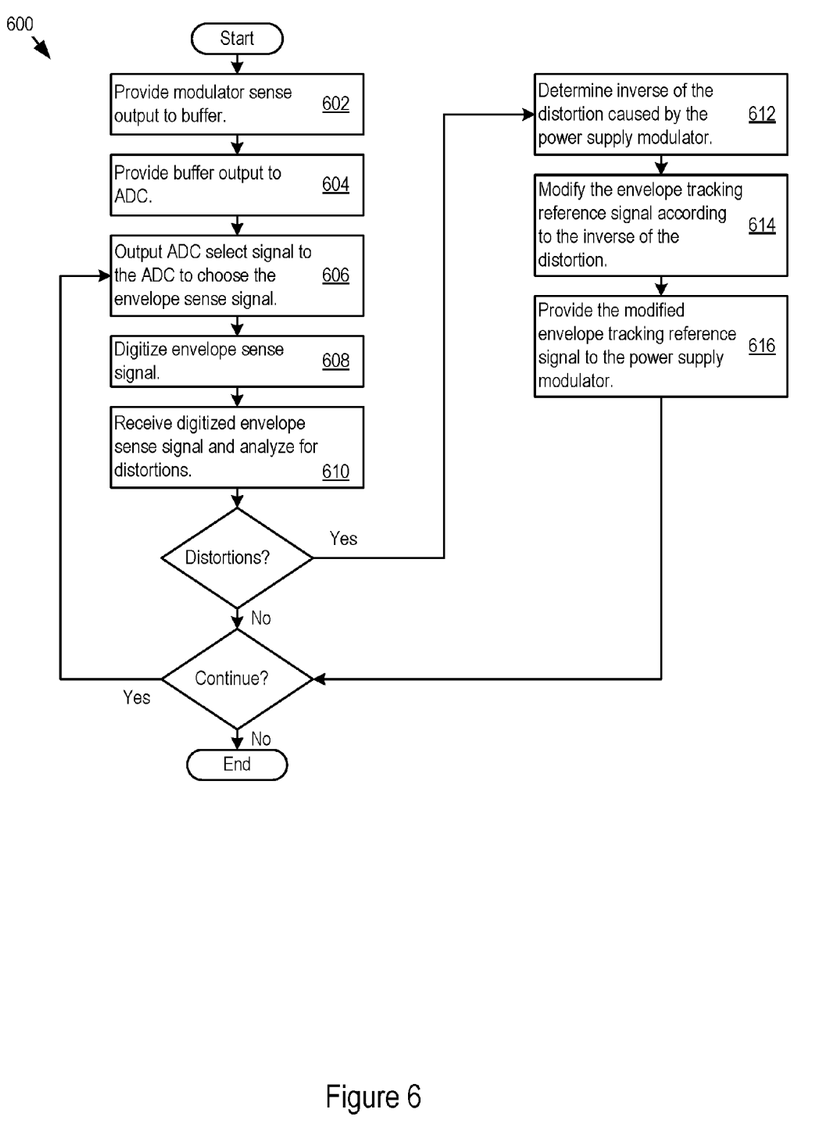
FIG. 6 shows an example of logic that may be implemented to address non-linearity in the power supply modulator.

FIG. 6 shows an example of logic 600 that may be implemented, e.g., by the baseband controller 302 and other system components, to address non-linearity in the power supply modulator 502. The logic 600 includes providing a modulator sense output to a buffer (602), and providing the buffer output to an ADC (604). The logic 600 includes outputting, e.g., from the baseband controller 302, an ADC select signal to the ADC to choose digitization of the envelope sense signal. The ADC digitizes the envelope sense signal and provides the digitized signal to the baseband controller 302 (608).

The baseband controller 302 receives the digitized envelope sense signal, and analyzes it for distortions compared to the known envelope reference output (610). If distortions (e.g., non-linearities) are found, then the baseband controller 302 may determine the inverse of the distortion that the power supply modulator 502 causes to the envelope tracking reference signal (612). The baseband controller 302 may then modify the envelope tracking reference signal according to the inverse of the distortion (614). The baseband controller 302 provides the modified envelope tracking reference signal to the power supply modulator 502 (616). The output of the power supply modulator 502 is then $f(f^{-1}(Venv))=Venv$, where $f(x)$ is the distortion caused by the power supply modulator 502, $f^{-1}(x)$ is the inverse of the distortion, and Venv is the desired output from the power supply modulator 502.

Another aspect of the operation of the baseband controller 302 is to counteract gain flatness in the power supply modulator 502. The circuitry used in the power supply modulator 502 may be characterized by poles and zeros limit bandwidth, and that may, for instance, cause gain reduction at higher frequencies. Because there may be high current handling capability and low loss requirements in the power supply modulator 502, the transistor sizes are fairly big and may introduce low-frequency poles. Hence, the power supply modulator 502 may be characterized by gain roll-off at high frequencies. However, the baseband controller 302 may pre-emphasize the high frequency content in the envelope tracking reference signal so that after the effects of gain roll-off in the power supply modulator 502, the final frequency response is flat.

Note also that with each device and chip fabrication, there are often process, voltage and temperature variations. As a result, the non-linearity characteristics and the frequency response of the power supply modulator 502 will vary from part to part. For robust performance, closed loop calibration may execute to determine the pre-distortion and pre-emphasis characteristics that the baseband controller 302 will apply on a nominal basis.

The receive circuitry 512 may facilitate the calibration. Note also that the receive circuitry 512 may be used in a time division duplex (TDD) manner to support both modulator sense signal measurements, and reception and processing of, e.g., WLAN signals. The buffer 522 (e.g., a high-impedance buffer) provides the output of the power supply modulator 502 to the ADC 518. The baseband controller 302 asserts the selection signal output 520 to choose the modulator sense signal from the ADC 518. The baseband controller 302 may do so as it provides reference calibration envelope signals to the power supply modulator 502. The comparison of the received modulator sense signal against the reference calibration signals indicate the distortions resulting from the power supply modulator 502. Expressed another way, the baseband controller 302 may provide known calibration signal sequences on the envelope path to the power supply modulator 502. The baseband controller 302 compares the sensed signal from the ADC 518 and the known calibration signals to characterize the distortions (e.g., non-linearity) and frequency response of the power supply modulator 502. The baseband controller 302 may perform the pre-distortion and pre-emphasis in an adaptive manner to facilitate wideband and efficient operation of the envelope tracking power supply modulator 502.

The linearity and gain flatness of the buffer 522 on the sense path may be chosen to be better than that of the power supply modulator 502 by a specified threshold amount. One way to facilitate better linearity and gain flatness is to increase the quiescent current consumption of the buffer 522. As the baseband controller 302 may activate the buffer 522 during closed-loop calibration and deactivate the buffer during other operations (e.g., normal cellular signal transmission), the duty-cycle averaged current consumption may be quite a low fraction of the overall current, thereby limiting the impact on overall system efficiency.

While specific implementations have been shown and described, other implementations are possible.

What is claimed is:

1. A device comprising:
   a baseband controller; and
   a supply modulator operable to:
   receive an envelope tracking reference signal from the baseband controller;
   generate, according to a linearity characteristic, an envelope tracking power supply signal responsive to the envelope tracking reference signal;
   provide an envelope sense signal responsive to the envelope tracking power supply signal that reflects the linearity characteristic;
   where the baseband controller is configured to:
   responsive to determining that a wireless networking communication is active, output a selection signal configured to cause delivery of the envelope sense signal to the baseband controller;
   responsive to the selection signal, receive the envelope sense signal from the supply modulator; and
   pre-distort the envelope tracking reference signal responsive to the linearity characteristic reflected in the envelop sense signal.

2. The device of claim 1, where:
   the linearity characteristic comprises linearity of a voltage regulator in the supply modulator.

3. The device of claim 2, where:
   the voltage regulator comprises a linear regulator.

4. The device of claim 1, where:
   the linearity characteristic comprises linearity over a wireless networking bandwidth.

5. The device of claim 1, where:
   the linearity characteristic comprises linearity over a wireless networking bandwidth for 802.11 based communication.

6. The device of claim 1, further comprising:
   an analog to digital converter operable to:
   receive the envelope sense signal; and
   deliver the envelope sense signal in digital form to the baseband controller.

7. The device of claim 6, where the analog to digital converter is further configured to compare the envelope sense signal to a calibration signal to determine the linearity characteristic.

8. The device of claim 1, further comprising:
   a buffer adapted to receive the envelope sense signal prior to receipt by the baseband controller.

9. The device of claim 1, further comprising:
   an analog to digital converter operable to:
   receive the envelope sense signal; and
   responsive to the selection signal, deliver the envelope sense signal in digital form to the baseband controller.

10. The device of claim 1, where the wireless communication comprises a spectral width of at least 20 MHz.

11. The device of claim 1, where the baseband controller is configured to pre-distort the envelope tracking reference signal to at least partially compensate for the linearity characteristic.

12. A method comprising:
    at a power supply modulator:
    receiving an envelope tracking reference signal from a baseband controller;
    generating, according to a linearity characteristic, an envelope tracking power supply signal responsive to the envelope tracking reference signal; and
    when a selection signal is asserted, providing an envelope sense signal responsive to the envelope tracking power supply signal that reflects the linearity characteristic;
    at the baseband controller:
    responsive to determining that a wireless communication is active, asserting the selection signal;
    receiving, from the power supply modulator, the envelope sense signal to facilitate pre-distortion of the envelope tracking reference signal; and
    pre-distorting the envelope tracking reference signal responsive to the linearity characteristic reflected in the envelope sense signal.

13. The method of claim 12, further comprising:
    generating a digital sample from the envelope sense signal; and
    providing the digital sample to the baseband controller for use in pre-distorting the envelope tracking reference signal.

14. The method of claim 12, further comprising:
    providing the envelope tracking reference signal to the power supply modulator that generates the envelope sense signal.

15. The method of claim 12, where the wireless communication comprises a spectral width of least 20 MHz.

16. The method of claim 12, where receiving the envelope sense signal comprises receiving an envelope sense signal that reflects a linearity over a wireless networking bandwidth.

17. The method of claim 12, further comprising comparing the envelope sense signal to a calibration signal to determine the linearity characteristic.

18. A device comprising:
    a baseband controller comprising:
    a selection output;
    a signal input; and
    a radio frequency envelope output;
    an envelope tracking power supply modulator operable to:
    receive an envelope tracking reference signal from the baseband controller on the radio frequency envelope output;

apply the envelope tracking reference signal to a linear regulator that is characterized by a linearity characteristic to generate a regulated output responsive to the envelope tracking reference signal; and output an envelope tracking power supply signal and an envelope sense signal responsive to the regulated output;

a buffer operable to receive the envelope sense signal and comprising a buffer output; and an analog to digital converter coupled to the buffer output and to the baseband controller, where the baseband controller is configured to:

selectively determine when to receive the envelope sense signal from the analog to digital converter and pre-distort the envelope tracking reference signal to at least partially compensate for the linearity characteristic.

19. The device of claim 18, where:

the baseband controller determines to pre-distort the envelope tracking reference signal when the envelope tracking power supply modulator is generating the envelope tracking power supply signal to support wireless networking communications over at least 20 MHz of bandwidth.

20. The device of claim 18, where:

the baseband controller is configured to output a selection signal configured to cause delivery of the envelope sense signal to the baseband controller.

* * * * *